(12) United States Patent
Maki et al.

(10) Patent No.: US 10,466,728 B2
(45) Date of Patent: Nov. 5, 2019

(54) SEMICONDUCTOR INTEGRATED CIRCUIT FOR REGULATOR

(71) Applicants: Shinichiro Maki, Hiratsuka (JP);
Yoichi Takano, Hadano (JP);
Katsuhiro Yokoyama, Atsugi (JP)

(72) Inventors: Shinichiro Maki, Hiratsuka (JP);
Yoichi Takano, Hadano (JP);
Katsuhiro Yokoyama, Atsugi (JP)

(73) Assignee: MITSUMI ELECTRIC CO., LTD., Tokyo (JP)

(*) Notice: Subject to any disclaimer, the term of this patent is extended or adjusted under 35 U.S.C. 154(b) by 0 days.

(21) Appl. No.: 16/186,099

(22) Filed: Nov. 9, 2018

(65) Prior Publication Data

US 2019/0146535 A1   May 16, 2019

(30) Foreign Application Priority Data

Nov. 10, 2017   (JP) .................. 2017-216962

(51) Int. Cl.
*G05F 1/573* (2006.01)
*G05F 1/575* (2006.01)
*H01L 27/02* (2006.01)
*H02H 9/02* (2006.01)

(52) U.S. Cl.
CPC .............. *G05F 1/575* (2013.01); *G05F 1/573* (2013.01); *H01L 27/0255* (2013.01); *H01L 27/0259* (2013.01); *H02H 9/02* (2013.01)

(58) Field of Classification Search
CPC ... G05F 1/10; G05F 1/267; G05F 1/46; G05F 1/561; G05F 1/567; G05F 1/569; G05F 1/571; G05F 1/573; G05F 1/5735; G05F 1/461; G05F 1/462; G05F 1/463; G05F 1/465; G05F 1/466; G05F 1/467; G05F 1/56; G05F 1/562; G05F 1/563; H02M 2001/0067; H02M 2001/0045
USPC .................. 257/676, 777, E23.04, E23.037; 323/271–285
See application file for complete search history.

(56) References Cited

U.S. PATENT DOCUMENTS

| | | | |
|---|---|---|---|
| 5,548,134 A * | 8/1996 | Tailliet | H01L 27/0259 257/111 |
| 7,710,086 B1 * | 5/2010 | Stamps | H02M 3/1584 323/266 |
| 2012/0062198 A1 * | 3/2012 | Takano | G05F 1/565 323/282 |

FOREIGN PATENT DOCUMENTS

| | | |
|---|---|---|
| JP | S61285751 A | 12/1986 |
| JP | H03139881 A | 6/1991 |

\* cited by examiner

*Primary Examiner* — Yusef A Ahmed
*Assistant Examiner* — Bryan R Perez
(74) *Attorney, Agent, or Firm* — Holtz, Holtz & Volek PC (57) ABSTRACT

A semiconductor integrated circuit for a regulator includes an output controlling transistor, a controller circuit, a breeder resister and a current limiting resistor. The output controlling transistor is connected between an output terminal and a voltage input terminal. The breeder resister is connected between the output terminal and a constant potential point and generates the feedback voltage. The current limiting resistor is connected with the breeder resister between the output terminal and the constant potential point.

8 Claims, 5 Drawing Sheets

SEMICONDUCTOR INTEGRATED CIRCUIT FOR REGULATOR

CROSS REFERENCE TO RELATED APPLICATION

This application is based upon and claims the benefit of priority under 35 USC 119 of Japanese Patent Application No. 2017-216962 filed on Nov. 10, 2017, the entire disclosure of which, including the description, claims, drawings and abstract, is incorporated herein by reference in its entirety.

BACKGROUND OF THE INVENTION

1. Field of the Invention

The present invention relates to a semiconductor integrated circuit, particularly an electrostatic protection circuit in a bipolar integrated circuit. For example, the present invention relates to a technique that is useful for an electrostatic protection circuit in a semiconductor integrated circuit (regulator IC) of a voltage regulator such as a series regulator.

2. Description of Related Art

A series regulator (hereinafter referred to simply as a regulator) is a type of power-supply apparatuses that output a DC voltage at a desired potential by controlling a transistor disposed between a DC voltage input terminal and an output terminal. In recent years, such regulators have been constituted as regulator ICs of semiconductor integrated circuits, an example of which is illustrated in FIG. 6.

In semiconductor integrated circuits, an electrostatic protection diode is generally connected to an input or output terminal as a measure against static electricity that prevents breakage of an internal element such as a transistor (for example, see JP S61-285751A and JP H03-139881A).

Figure 6:
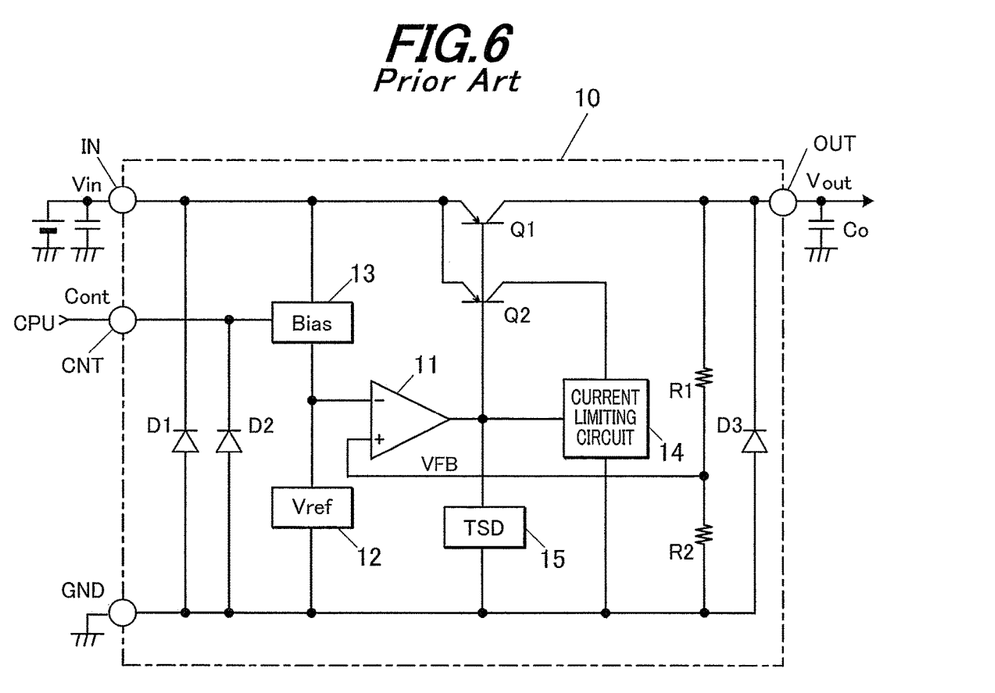
FIG. 6 is a circuit configuration diagram of an example of a series regulator IC of the prior art.

In regulator ICs, for example, electrostatic protection diodes D1, D2, D3 are connected to a voltage input terminal IN, a control signal input terminal CNT and a voltage output terminal OUT of a regulator as illustrated in FIG. 6.

An example application of regulator ICs is a system with an output terminal that is configured to be connected to an external device through a connector or the like (e.g. a car communication system and a car audio system). In such systems, an output terminal of an IC serves as an external connection terminal for supplying electric power from a regulator to an external device.

Accordingly, when checking such a system, a negative surge may sometimes be applied to the output terminal of the regulator IC due to the L component of a connected device or a connection cable. In the configuration as illustrated in FIG. 6, an overcurrent (surge current) may sometimes break the electrostatic protection diode D3.

Specifically, when the potential at the output terminal of the IC falls below a ground potential, a forward current flows through the electrostatic protection diode D3 in FIG. 6 so that a transistor Q1 can be protected from the negative surge voltage. However, the typical electrostatic protection diode D3 can only protect the transistor Q1 from a negative surge of a several volt. An application of a larger negative surge voltage will break the electrostatic protection diode D3.

Figure 7A:
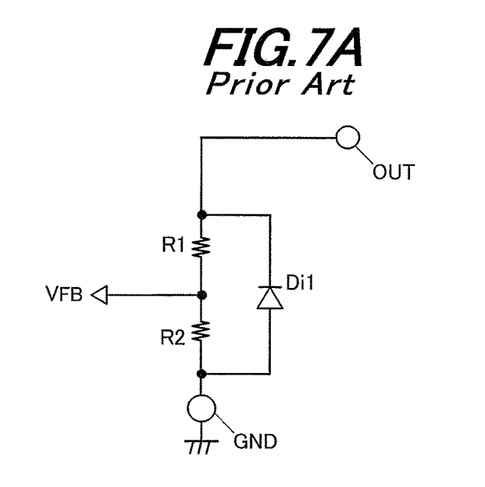
FIG. 7A is an equivalent circuit diagram of breeder resistor portion of the series regulator IC of the prior art.
Figure 7B:
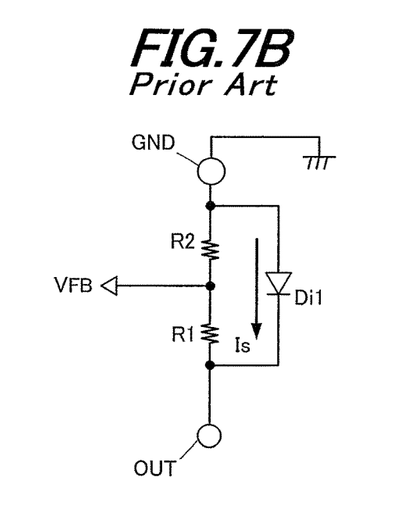
FIG. 7B is a circuit diagram illustrating the state of the breeder resistor portion when a negative surge is applied to an output terminal of the series regulator IC of the prior art.

In some regulator ICs, breeder resistors R1, R2 as illustrated in FIG. 6 are provided in a chip to generate an output feedback voltage $V_{FB}$. In such ICs, when the breeder resistor R1, R2, which are connected in parallel to the electrostatic protection diode D3, are constituted by p-type diffusion layers that are formed in an n-type well region of a semiconductor substrate, a reverse parasitic diode (body diode) Di1 is present in the breeder resistor portion as illustrated in FIG. 7A. When a large negative surge voltage is applied to the output terminal OUT as described above, the parasitic diode Di1 is subjected to a forward voltage so that a surge current Is flows through a wiring connecting the output terminal OUT and the resistor R1 as illustrated in FIG. 7B.

In general, breeder resistors of a regulator IC have a high resistance (several hundred kΩ) in order that a large current does not flow in a normal operating state for reducing the power consumption. The wiring between the breeder resistors and the output terminal is not designed to have such a width that allows flow of a large current.

The present inventors found that when a surge voltage is applied, a large current flowing through the parasitic diode Di1 may cause a damage on the wiring such as fusion and disconnection.

SUMMARY OF THE INVENTION

The present invention has been made in view of the above-described problem, and an object thereof is to provide an electrostatic protection technique that can prevent a semiconductor integrated circuit (regulator IC) of a DC power supply such as a series regulator caused from breakage that is caused by a damage on wiring such as fusion and disconnection when a negative surge voltage is applied to an output terminal.

JP S61-285751A and JP H03-139881 are both related to electrostatic protection techniques for CMOS integrated circuits in which polysilicon layers serve as resistors. In contrast, the present invention is to provide an electrostatic protection technique for regulator ICs of bipolar integrated circuits in which diffusion layers serve as resistors. That is, there is a difference in application.

To achieve at least one of the abovementioned objects, according to an aspect of the present invention, a semiconductor integrated circuit for a regulator includes:

an output controlling transistor which includes a bipolar transistor connected between an output terminal and a voltage input terminal to which a DC voltage is input;

a controller circuit which controls the output controlling transistor according to a feedback voltage of an output voltage;

a breeder resister which is connected between the output terminal and a constant potential point and which generates the feedback voltage by dividing the output voltage; and a current limiting resistor which is connected in series with the breeder resistor between the output terminal and the constant potential point.

Preferably, the breeder resistor includes a first diffusion layer which is formed in a surface of a first semiconductor island region on a semiconductor substrate, the first semiconductor island region being surrounded by a first isolation region;

the current limiting resistor includes a second diffusion layer which is formed in a surface of a second semiconductor island region surrounded by a second isolation region, the second semiconductor island region being different from the first semiconductor island region; and the current limiting resistor has such a resistance that prevents a potential difference across the current limiting resistor at a current in a normal operating state from exceeding a forward voltage of a base diode parasitic to the current limiting resistor.

In the semiconductor integrated circuit for a regulator having the above-described configuration, even when a negative surge voltage is applied to the output terminal, the current limiting resistor can limit the current flowing toward the output terminal through the body diode parasitic to the breeder resistor. Further, the body diode parasitic to the current limiting resistor is off when a negative surge voltage is applied since it is in the reverse direction, and the voltage applied to the body diode parasitic to the current limiting resistor does not exceed the forward voltage at a current in a normal operating state since the current limiting resistor serves as a resistor. Therefore, the regulator can be prevented from breakage due to fusion and disconnection of a wiring even when a negative surge voltage is applied to the output terminal.

It is desirable that the current limiting resistor is connected in series with the breeder resistor between the output terminal and the breeder resistor.

It is also theoretically possible that the current limiting resistor is connected between the breeder resistor and the ground terminal as long as it is connected in series with the breeder resistor. Depending on the element structure, such configuration in which the current limiting resistor is connected between the breeder resistor and the ground terminal may cause a problem in a device. In contrast, the above-described configuration can reduce a surge current to prevent a breakage due to a damage on a wiring such as fusion and disconnection.

Preferably, the breeder resistor includes a first diffusion layer which is formed in a surface of a first semiconductor island region on a semiconductor substrate, the first semiconductor island region being surrounded by a first isolation region;

the current limiting resistor includes a second diffusion layer which is formed in a surface of a second semiconductor island region surrounded by a second isolation region, the second semiconductor island region being different from the first semiconductor island region; and the current limiting resistor is connected between the output terminal and an island electrode of the first semiconductor island region including the breeder resistor.

When a negative surge voltage is applied to the output terminal, this configuration can also prevent a breakage due to a damage on a wiring such as fusion and disconnection without causing any trouble.

Preferably, the controller circuit includes a vertical bipolar transistor which includes:

a first buried layer of a first conductivity type which is formed as a collector region in the semiconductor substrate;

a third diffusion layer of a second conductivity type which is formed as a base region in a surface of a semiconductor island region of an epitaxial layer above the first buried layer; and a fourth diffusion layer of the first conductivity type which is formed as an emitter region inside the base region, the breeder resistor and the current limiting resistor are constituted by the first and second diffusion layers of the second conductivity type which are formed in the surfaces of the first and second island regions of the epitaxial layer that are electrically insulated from each other, and the bipolar transistor that constitutes the output controlling transistor is a horizontal bipolar transistor or a vertical bipolar transistor including a second buried layer of the second conductivity type.

In this configuration, it is possible to form the diffusion layer as the current limiting resistor without adding any extra step to a production process of conventional bipolar integrated circuits, and it is therefore possible to avoid a cost increase.

The present invention is advantageous in providing the electrostatic protection technique for semiconductor integrated circuits (regulator ICs) of DC power supplies such as series regulators, which is useful for preventing breakage due to a damage on a wiring such as fusion and disconnection when a negative surge voltage is applied to the output terminal.

BRIEF DESCRIPTION OF THE DRAWINGS

The advantages and features provided by one or more embodiments of the invention will become more fully understood from the detailed description given hereinbelow and the appended drawings which are given by way of illustration only, and thus are not intended as a definition of the limits of the present invention, and wherein.

DETAILED DESCRIPTION OF THE PREFERRED EMBODIMENT

Hereinafter, a preferred embodiment of the present invention will be described with the drawings. However, the scope of the invention is not limited to the disclosed embodiments.

Figure 1:
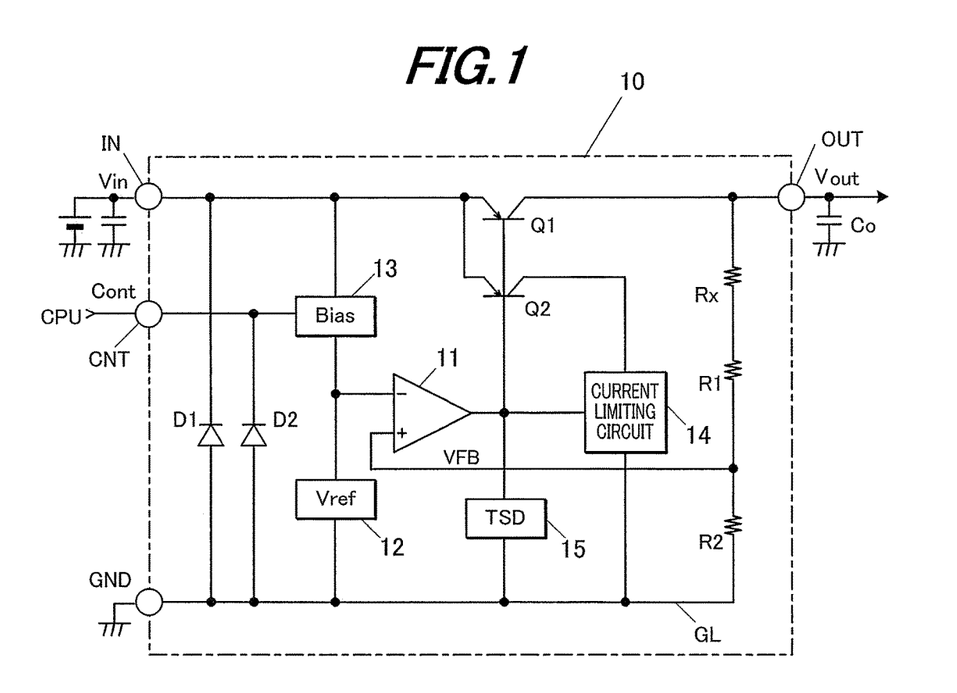
FIG. 1 is a circuit configuration diagram of a series regulator IC according to an embodiment of the present invention.

FIG. 1 illustrates a series regulator as a DC power supply according to an embodiment of the present invention. In FIG. 1, the portion surrounded by the dashed-dotted line is formed as a semiconductor integrated circuit (regulator IC) 10 on a semiconductor chip of single-crystal silicone or the like, and a capacitor Co is connected to an output terminal OUT of the regulator IC 10. This portion functions as a DC power supply that supplies a stable DC voltage.

In the regulator IC 10 of the embodiment, a voltage controlling transistor Q1 is connected between a voltage input terminal IN to which a DC voltage $V_{in}$ is applied and an output terminal OUT as illustrated in FIG. 1. The transistor Q1, which is constituted by a PNP bipolar transistor, is controlled by an error amplifier 11. Breeder resistors R1, R2 are connected in series between the output terminal OUT and a ground line GL connected to the ground terminal GND. The breeder resistors R1, R2 divide the output voltage $V_{out}$ to generate a feedback voltage $V_{FB}$ for the error amplifier 11. In the embodiment, a current limiting resistor Rx is further connected in series with the breeder resistors R1, R2 between the output terminal OUT and the breeder resistor R1.

In the embodiment, the breeder resistors R1, R2 and the current limiting resistor Rx are constituted by diffusion layers formed in the surface of a semiconductor substrate. The breeder resistors R1, R2 typically have a resistance of 100 kΩ or more in order to reduce power consumption at the breeder resistors R1, R2. In contrast, the resistor Rx has a resistance of approximately from 100Ω to kΩ so that a body diode (hereinafter referred to as a parasitic diode) parasitic in the resistor Rx is not turned on, i.e. the voltage across the resistor Rx does not exceed the forward voltage (typically about 0.7 V) of the parasitic diode. That is, the resistance of the current limiting resistor Rx is 1/100 or less of the resistance of the breeder resistors R1, R2.

While electrostatic protection diodes D1, D2 are connected respectively to the voltage input terminal IN and a control signal input terminal CNT, no electrostatic protection diode is connected to the output terminal OUT. Instead of an electrostatic protection diode, the resistor Rx functions as an electrostatic protection element. The electrostatic protecting function of the resistance Rx will be described later.

In the regulator IC 10, the voltage $V_{FB}$ divided by the breeder resistors R1, R2 is fed back to a non-inverting input terminal of the error amplifier 11 that serves as an error amplifier circuit for controlling the base of the voltage controlling transistor Q1. The error amplifier 11 controls the voltage controlling transistor Q1 based on the potential difference between the output feedback voltage $V_{FB}$ and a predetermined reference voltage $V_{ref}$ so as to maintain the output voltage $V_{out}$ at a desired potential.

The regulator IC 10 according to the embodiment further includes:

a reference voltage circuit 12 that generates the reference voltage $V_{ref}$ applied to an inverting input terminal of the error amplifier 11;

a bias circuit 13 that supplies an operating current to the error amplifier 11 and the reference voltage circuit 12; a current limiting circuit 14 that is connected to the base of the output controlling transistor Q1 to limit the output current; and a thermal shutdown circuit (STD) 15 that stops the operation of the error amplifier 11 to turn off the transistor Q1 when the chip is heated to a predetermined temperature or more.

The reference voltage circuit 12 can be constituted by a series resistor, a Zener diode and the like. The bias circuit 13 has a function of supplying or cutting off a bias current to the error amplifier 11 according to a control signal $C_{ont}$ that is input to the control signal input terminal CNT from an external microcomputer (CPU) or the like. The current limiting circuit 14 limits the output current by clamping a base current not to exceed a predetermined level when an increase of the output current and a decrease of the output voltage $V_{out}$ due to an abnormality of a load or the like is about to cause the error amplifier 11 to decrease the base voltage to increase the current flowing through the transistor Q1.

The regulator IC 10 according to the embodiment further includes a bipolar transistor Q2 that is disposed in parallel to the voltage controlling transistor Q1 to constitute a current mirror circuit along with the transistor Q1. The same voltage as the voltage applied to the base of the voltage controlling transistor Q1 is applied to the base as a controlling terminal of the transistor Q2. That is, the current flowing through the transistor Q2 is proportional (1/N) to a collector current of the transistor Q1 according to the size ratio N of the element. The current limiting circuit 14 is configured to monitor the current through the current mirror transistor Q2 to detect an increase of the output current and to clamp the base voltage of the transistor Q1.

Figure 2A:
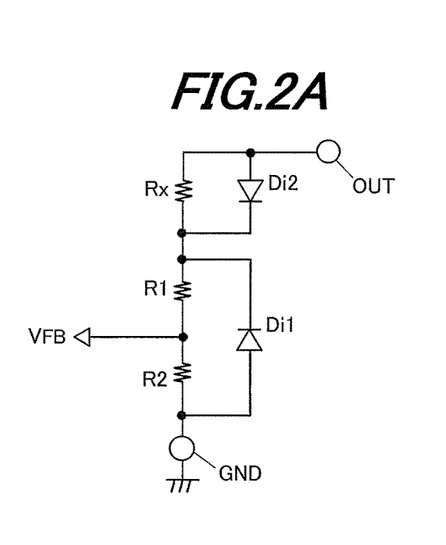
FIG. 2A illustrates the operation of the breeder resistor portion of the regulator IC in FIG. 1 according to the embodiment, which is an equivalent circuit diagram of the breeder resistor portion in a normal operating state.

Next, the electrostatic protecting function of the current limiting resistor Rx of the regulator IC 10 according to the embodiment will be described with FIG. 2. FIG. 2A is an equivalent circuit diagram of the breeder resistor portion in a normal operating state, and FIG. 2B is an equivalent circuit diagram of the breeder resistor portion in an abnormal operating state (when a negative surge is applied to the OUT terminal).

When the breeder resistors R1, R2 are constituted by diffusion layers that are formed in the surface of a semiconductor substrate, they can be represented by the equivalent circuit in FIG. 2A. In the equivalent circuit, the parasitic diode Di1 is connected in parallel to the resistors R1, R2 in the reverse direction with respect to the direction from the output terminal OUT to the ground terminal GND. Further, another parasitic diode Di2 is connected in parallel to the current limiting resistor Rx in the forward direction with respect to the direction from the output terminal OUT to the ground terminal GND.

In a normal operating state, no current flows through the reverse parasitic diode Di1, and all the current from the current limiting resistor Rx flows through the breeder resistors R1, R2. As described above, the resistor Rx has a resistance of approximately from several hundred Ω to several kΩ in the embodiment. Even when a current of from several hundred nA to several mA flows through the resistor Rx in a normal operating state, the voltage across the resistor Rx does not exceed 0.7 V, the forward voltage of the diode. Since the parasitic diode Di2 is not turned on and the voltage drop due to the resistor Rx having such a low resistance is small, the resistor Rx hardly affects the feedback voltage $V_{FB}$. Instead of the resistance ratio between the breeder resistors R1, R2, the regulator IC may be designed such that the feedback voltage $V_{FB}$ is determined based on the ratio between (Rx+R1) and R2.

Figure 2B:
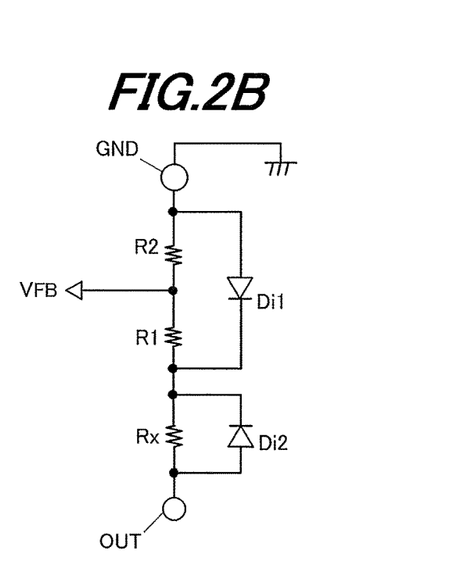
FIG. 2B illustrates the operation of the breeder resistor portion of the regulator IC in FIG. 1 according to the embodiment, which is an equivalent circuit diagram of the breeder resistor portion in an abnormal operating state (when a negative surge is applied to a terminal OUT)

When a negative surge is applied to the output terminal OUT, the breeder resistor portion can be represented by the equivalent circuit in FIG. 2B. In the equivalent circuit, the parasitic diode Di1 is connected in parallel to the breeder resistors R1, R2 in the forward direction with respect to the direction from the ground terminal GND to the output terminal OUT, and the parasitic diode Di2 is connected in parallel to the current limiting resistor Rx in the reverse direction with respect to the direction from the ground terminal GND to the output terminal OUT. Therefore, the parasitic diode Di1 is on, and the parasitic diode Di2 is off in this state.

When the current limiting resistor Rx and the parasitic diode Di2 are not provided (see FIG. 7B), a large surge current flows through the parasitic diode Di1 of the breeder resistors R1, R2 to cause fusion and disconnection of a wiring between the resistor R1 and the output terminal OUT. However, in the embodiment, the parasitic diode Di2 is turned off to direct all the current from the parasitic diode Di1 to the resistor Rx, and the resistor Rx limits the current. As a result, the wiring between the resistor Rx and the output terminal OUT can be prevented from fusion and disconnection.

Figure 3A:
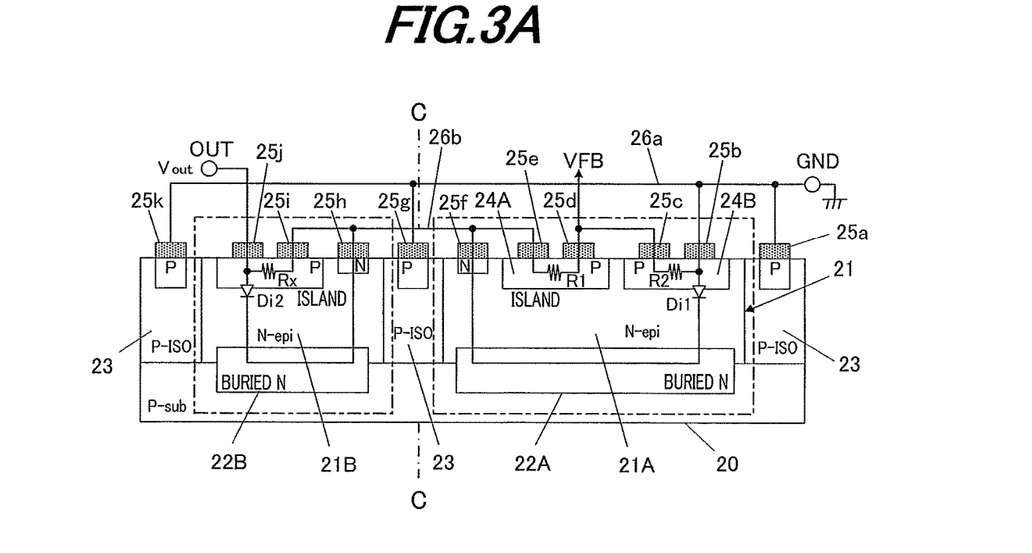
FIG. 3A is a cross-sectional view of a substrate, illustrating the structure of the breeder resistor portion of the regulator IC in FIG. 1 according to the embodiment.
Figure 3B:
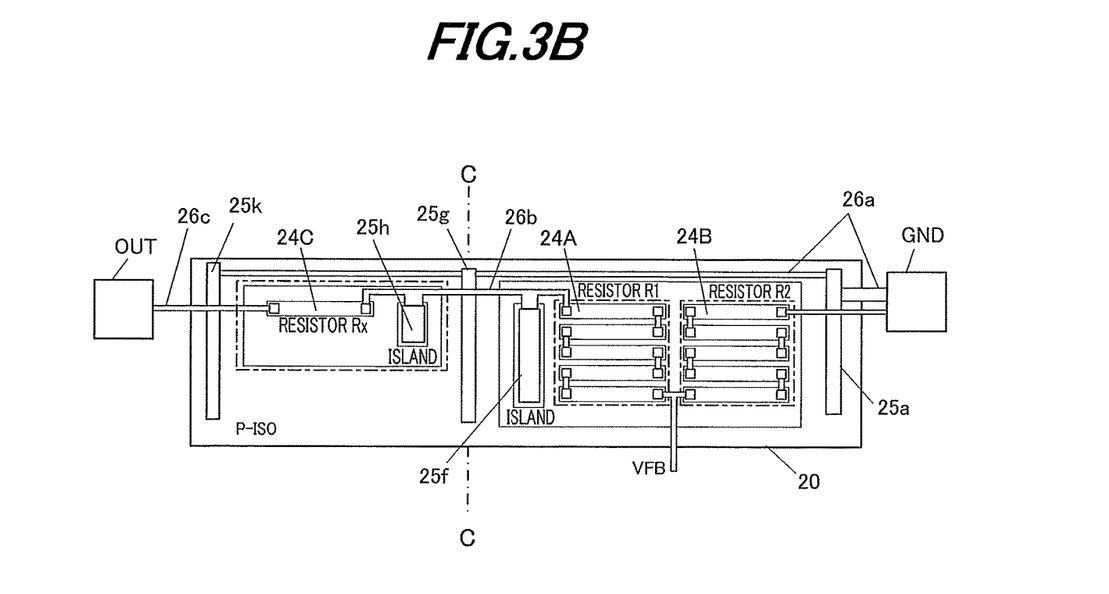
FIG. 3B is a plan view illustrating the layout of the breeder resistor portion of the regulator IC in FIG. according to the embodiment.
Figure 4A:
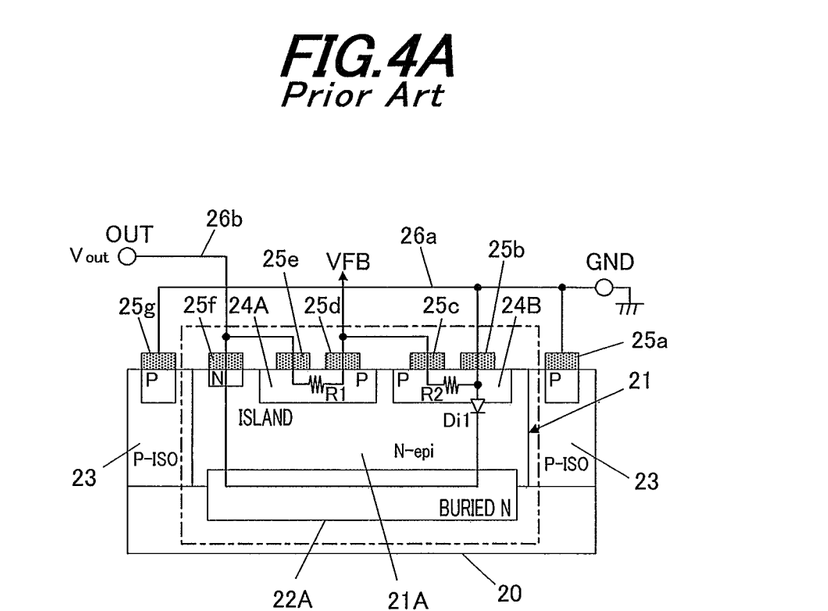
FIG. 4A is a cross-sectional view of a substrate, illustrating the structure of a breeder resistor portion of a series regulator IC of the prior art.
Figure 4B:
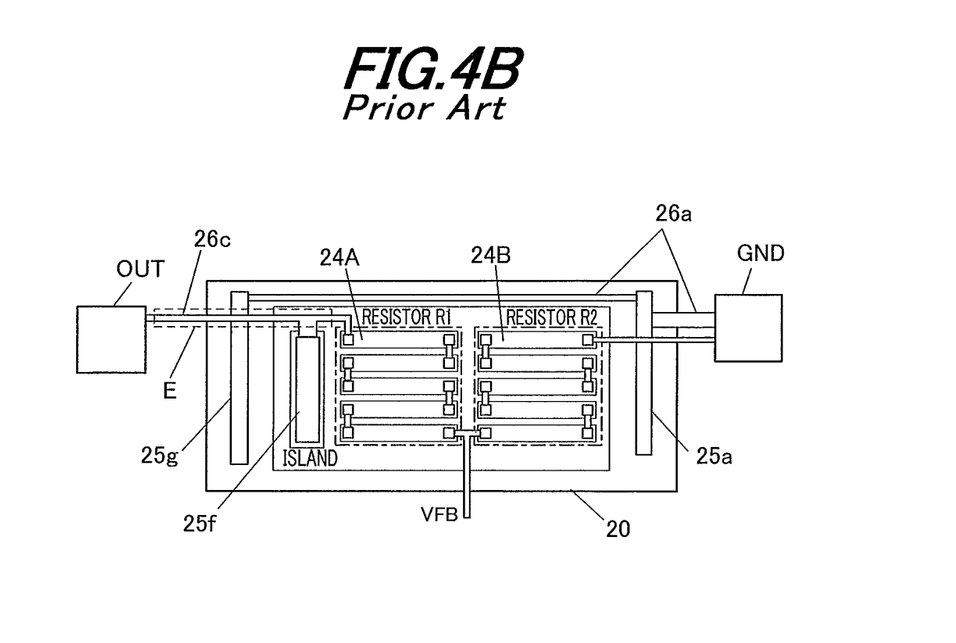
FIG. 4B is a plan view illustrating the layout of the breeder resistor portion of the series regulator IC of the prior art.

Next, the structural difference between the breeder resistor portion of the regulator IC 10 of the embodiment and a breeder resistor portion of a regulator IC of the prior art will be described with FIG. 3 and FIG. 4. FIG. 3A is a cross-sectional view of a semiconductor substrate illustrating the element structure of the breeder resistors R1, R2 and the current limiting resistor Rx according to the embodiment, and FIG. 3B is a plan view illustrating the layout thereof. FIG. 4A is a cross-sectional view of a semiconductor substrate illustrating the element structure of the breeder resistors R1, R2 of the regulator IC of the prior art, and the FIG. 4B is a plan view illustrating the layout thereof.

In FIG. 3A and FIG. 3B, the right side of the figures with respect to the dashed-dotted line C-C illustrates the structure and the layout of the breeder resistors R1, R2, and the left side illustrates the structure and the layout of the current limiting resistor Rx.

As illustrated in FIG. 3A, an n-type buried layer 22A is formed at the boundary between a semiconductor substrate (P-sub) 20 of p-type single-crystal silicon or the like and an n-type epitaxial layer (N-epi) 21 formed on the semiconductor substrate 20. A p-type isolation region (P-ISO) 23 is formed to penetrate the n-type epitaxial layer (N-epi) 21 to surround the n-type buried layer 22A. P-type diffusion layers 24A, 24B are formed in the surface of an island 21A of the n-type epitaxial layer (N-epi) thus surrounded by the p-type isolation region (P-ISO) 23, which constitute respectively the breeder resistors R1, R2.

Similarly, another n-type buried layer 22B is formed, and the p-type isolation region (P-ISO) 23 is formed to surround the n-type buried layer 22B. A p-type diffusion layer 24C is formed in the surface of an island 21B of the n-type epitaxial layer (N-epi) thus formed, which constitutes the current limiting resistor Rx.

Electrodes 25a to 25k of a conductive material such as aluminum are electrically in contact with the surface of the p-type isolation region (P-ISO) 23, the surfaces of the islands 21A, 21B, the surfaces of the p-type diffusion layers 24A, 24B, 24C.

In order to maintain a reverse-biased state between the substrate and the elements, the electrodes 25a, 25g, 25k formed on the surface of the p-type isolation region (P-ISO) 23 are connected to the ground terminal (pad) GND through an aluminum wiring 26a (see FIG. 3B) so that the ground potential is applied thereto. Further, the island electrodes 25f, 25h formed on the surfaces of the islands 21A, 21B of the n-type epitaxial layer (N-epi) are connected to an aluminum wiring 26b (see FIG. 3B) that connects the p-type diffusion layer 24A as the breeder resistor R1 with the p-type diffusion layer 24C as the current limiting resistor Rx.

In the element structure as described above, the parasitic diode Di1 is present between the p-type diffusion layer 24 as the breeder resistor R2 and the island 21A of the n-type epitaxial layer (N-epi), and the parasitic diode Di2 is present between the p-type diffusion layer 24C as the current limiting resistor Rx and the island 21B of the n-type epitaxial layer (N-epi).

In contrast, the breeder resistors R1, R2 of the conventional regulator IC as illustrated in FIG. 4A and FIG. 4B has the same element structure and layout as the breeder resistors R1, R2 at the right side with respect to the dashed-dotted line C in the FIG. 3A and FIG. 3B, and a parasitic diode Di1 is present between a p-type diffusion layer 24B as the breeder resistor R2 and an island 21A of an n-type epitaxial layer (N-epi).

When a negative surge is applied to an output terminal OUT of the conventional element structure in FIG. 4A, a large surge current flows from the ground terminal GND to the output terminal OUT via an electrode 25b, the parasitic diode Di1 and an island electrode 25f. This may cause fusion and disconnection of an aluminum wiring 26c, which is surrounded by the dashed line E in FIG. 4B. In contrast, when a negative surge is applied to the output terminal OUT of the element structure according to the embodiment in FIG. 3A, the current from the electrode 26f through the parasitic diode Di1 flows into the current limiting resistor Rx. Therefore, the wiring 26c between the resistor Rx and the output terminal OUT in FIG. 3B can be prevented from fusion and disconnection.

Although not shown in the figures, the controller circuit with the error amplifier 11 in FIG. 1 includes a vertical NPN bipolar transistor as an active element, which is constituted by an n-type (first conductivity type) buried layer in the semiconductor substrate 20 as a collector region, a p-type (second conductivity type) diffusion layer formed in the surface of an island of an epitaxial layer on the buried layer as a base region, and an n-type (first conductivity type) diffusion layer formed in the base region as an emitter region. The p-type diffusion layers 24A, 24B, 24C of the breeder resistors R1, R2 and the current limiting resistor Rx can be formed simultaneously with the p-type diffusion layer of the base region of the vertical NPN bipolar transistor. This allows forming the resistors on the semiconductor substrate 20 without a dedicated step for forming the diffusion layers of the resistors and thereby can simplify the production process.

In the embodiment, the output controlling transistor Q1 is constituted as an PNP bipolar transistor. This PNP bipolar transistor Q1 is formed as a horizontal bipolar transistor on the same semiconductor (p-type) substrate with the controller circuit. However, the PNP bipolar transistor Q1 is not limited thereto. It can be constituted as a vertical bipolar transistor that includes a p-type buried layer as a collector region. The structure of horizontal or vertical PNP bipolar transistors is known in the art. The structure of the transistors in the embodiment is not shown in the figures since it is known in the art.

VARIATION

Figure 5A:
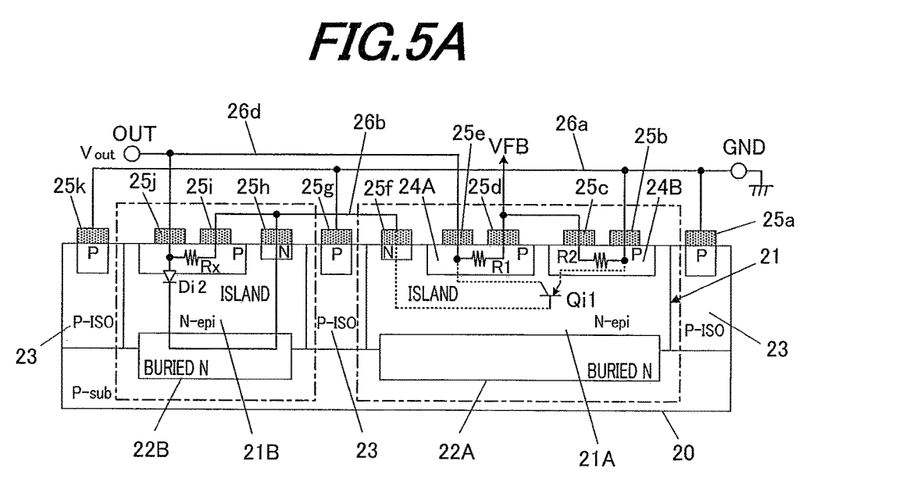
FIG. 5A illustrates a variation of the regulator in FIG. 1 according to the embodiment, which is a cross-sectional view illustrating the element structure of the breeder resistor portion.

Next, a variation of the regulator IC 10 according to the embodiment will be described with FIG. 5A and FIG. 5B. FIG. 5A is a cross-sectional view of the semiconductor substrate illustrating the element structure of the breeder resistors R1, R2 and the current limiting resistor Rx according to the variation, FIG. 5B is a plan view illustrating the layout thereof, and FIG. 5C is an equivalent circuit diagram.

Figure 5B:
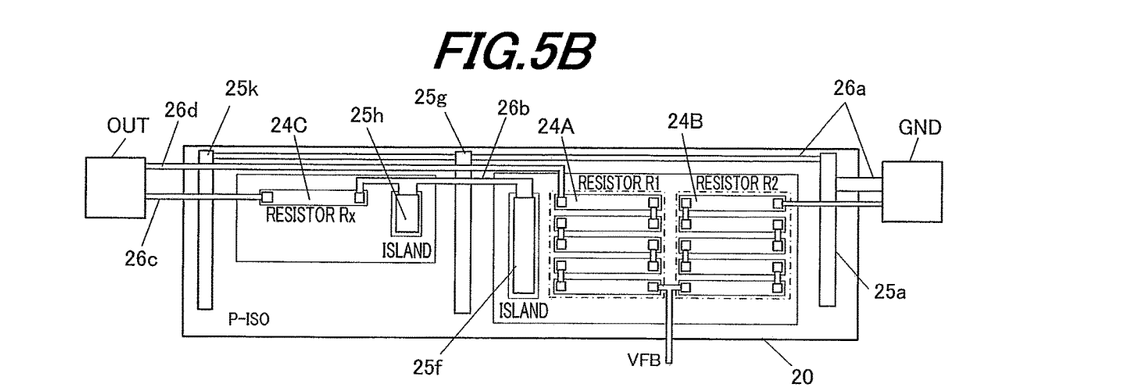
FIG. 5B illustrates the variation of the regulator in FIG. 1 according to the embodiment, which is a plan view illustrating the layout of the breeder resistor portion.
Figure 5C:
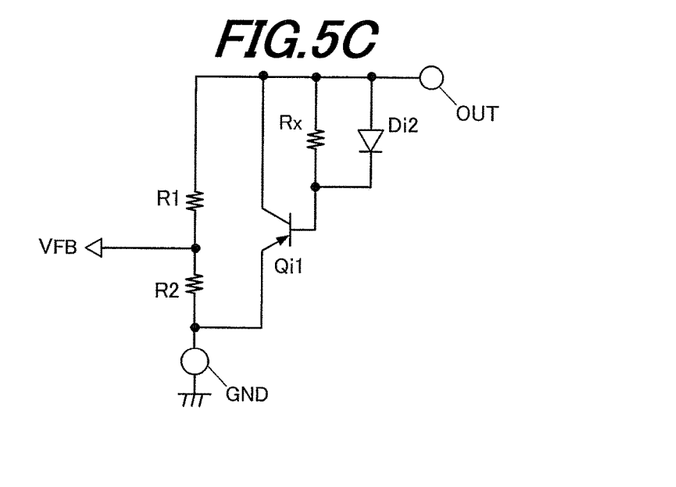
FIG. 5C illustrates the variation of the regulator in FIG. 1 according to the embodiment, which is an equivalent circuit diagram of the breeder resistor portion.

The variation in FIG. 5A and FIG. 5B has approximately the same configuration as the embodiment in FIG. 3. The difference is that while the electrode 25*e* of the p-type diffusion layer 24B as the breeder resistor R1 is connected to the island electrode 25*f* in FIG. 3, the electrode 25*e* is connected to the output terminal (pad) OUT via an aluminum wiring 26*d* as illustrated in FIG. 5B in the variation in FIG. 5A and FIG. 5B.

In the variation, a parasitic PNP bipolar transistor Qi is present between the p-type diffusion layers 24A, 24B as the breeder resistors R1, R2 and the substrate (n-type epitaxial layer, n-type buried layer) as illustrated by the dotted line in FIG. 5A. As illustrated in FIG. 5C, this structure is equivalent to the circuit diagram in which the current limiting resistor Rx is connected between the collector of the parasite bipolar transistor Qi and the output terminal OUT.

When a negative surge is applied to the output terminal OUT, a large surge current would flow from the ground terminal GND to the output terminal OUT via the electrode 25*b*, the transistor Qi and the electrode 25*e*. However, the resistor Rx connected between the parasite transistor Qi and the output terminal OUT as illustrated in FIG. 5C can prevent such surge current, and the wiring 26*c* can therefore be prevented from fusion and disconnection.

In the variation, when a negative surge is applied to the output terminal OUT, a current flows through the parasite PNP bipolar transistor Qi. However, the current through the parasitic transistor Qi is not large since the reverse-biased parasitic diode Di2 is off and the base current of the parasitic transistor Qi is limited by the current limiting resistor Rx. Therefore, the wiring and the substrate will not be damaged. In the variation, no current flows through the limiting resistor Rx in a normal operating state. Therefore, it is not necessary to select the resistance of the resistor Rx so that the voltage across the resistor Rx does not exceed the forward voltage of the parasitic diode Di2.

While the invention by the present inventors is specifically described with an embodiment, the present invention is not limited to the above-described embodiment. For example, in the above-described embodiment, the current limiting resistor Rx is provided in place of an electrostatic protection diode (D3 in FIG. 6) between the output terminal and the ground terminal in the conventional regulator IC. However, the current limiting resistor Rx may be provided without omitting the electrostatic protection diode (D3 in FIG. 6).

The above-described embodiment is an example in which the present invention is applied to a series regulator IC, and the present invention is applicable broadly to general semiconductor integrated circuits having an output terminal with a breeder resistor connected thereto.

What is claimed is:

1. A semiconductor integrated circuit for a regulator, comprising:
    an output controlling transistor which comprises a bipolar transistor connected between an output terminal and a voltage input terminal to which a DC voltage is input;
    a controller circuit which controls the output controlling transistor according to a feedback voltage of an output voltage;
    a breeder resistor which is connected between the output terminal and a constant potential point and which generates the feedback voltage by dividing the output voltage; and
    a current limiting resistor which is connected in series with the breeder resistor between the output terminal and the constant potential point,
    wherein:
    the breeder resistor comprises a first diffusion layer which is formed in a surface of a first semiconductor island region on a semiconductor substrate, the first semiconductor island region being surrounded by a first isolation region,
    the current limiting resistor comprises a second diffusion layer which is formed in a surface of a second semiconductor island region surrounded by a second isolation region, the second semiconductor island region being different from the first semiconductor island region,
    the current limiting resistor has a resistance that prevents a potential difference across the current limiting resistor at a current in a normal operating state from exceeding a forward voltage of a base diode parasitic to the current limiting resistor, and
    the first and second diffusion layers have a same conductivity type and are formed in surfaces of first and second island regions of an epitaxial layer that are electrically insulated from each other.

2. The semiconductor integrated circuit for a regulator according to claim 1, wherein the controller circuit comprises a vertical bipolar transistor which includes:
    a first buried layer of a first conductivity type which is formed as a collector region in the semiconductor substrate;
    a third diffusion layer of a second conductivity type which is formed as a base region in a surface of a semiconductor island region of the epitaxial layer above the first buried layer; and
    a fourth diffusion layer of the first conductivity type which is formed as an emitter region inside the base region.

3. The semiconductor integrated circuit for a regulator according to claim 1, wherein the bipolar transistor of the output controlling transistor is a horizontal bipolar transistor or a vertical bipolar transistor including a second buried layer of a second conductivity type.

4. A semiconductor integrated circuit for a regulator comprising:
    an output controlling transistor which comprises a bipolar transistor connected between an output terminal and a voltage input terminal to which a DC voltage is input;
    a controller circuit which controls the output controlling transistor according to a feedback voltage of an output voltage;
    a breeder resistor which is connected between the output terminal and a constant potential point and which generates the feedback voltage by dividing the output voltage; and
    a current limiting resistor which is connected in series with the breeder resistor between the output terminal and the constant potential point,
    wherein:
    the breeder resistor comprises a first diffusion layer which is formed in a surface of a first semiconductor island region on a semiconductor substrate, the first semiconductor island region being surrounded by a first isolation region, the current limiting resistor comprises a second diffusion layer which is formed in a surface of a second semiconductor island region surrounded by a second isolation region, the second semiconductor island region being different from the first semiconductor island region, the current limiting resistor is connected between the output terminal and an island electrode of the first semiconductor island region including the breeder resistor, and the first and second diffusion layers have a same conductivity type and are formed in surfaces of first and second island regions of an epitaxial layer that are electrically insulated from each other.

5. The semiconductor integrated circuit for a regulator according to claim 4, wherein the controller circuit comprises a vertical bipolar transistor which includes:

a first buried layer of a first conductivity type which is formed as a collector region in the semiconductor substrate;

a third diffusion layer of a second conductivity type which is formed as a base region in a surface of a semiconductor island region of the epitaxial layer above the first buried layer; and a fourth diffusion layer of the first conductivity type which is formed as an emitter region inside the base region.

6. The semiconductor integrated circuit for a regulator according to claim 4, wherein the bipolar transistor of the output controlling transistor is a horizontal bipolar transistor or a vertical bipolar transistor including a second buried layer of a second conductivity type.

7. A semiconductor integrated circuit for a regulator comprising:

an output controlling transistor which comprises a bipolar transistor connected between an output terminal and a voltage input terminal to which a DC voltage is input;

a controller circuit which controls the output controlling transistor according to a feedback voltage of an output voltage;

a breeder resistor which is connected between the output terminal and a constant potential point and which generates the feedback voltage by dividing the output voltage; and a current limiting resistor which is connected in series with the breeder resistor between the output terminal and the constant potential point, wherein:

the breeder resistor comprises a first diffusion layer which is formed in a surface of a first semiconductor island region on a semiconductor substrate, the first semiconductor island region being surrounded by a first isolation region, the current limiting resistor comprises a second diffusion layer which is formed in a surface of a second semiconductor island region surrounded by a second isolation region, the second semiconductor island region being different from the first semiconductor island region, the current limiting resistor is connected between the output terminal and an island electrode of the first semiconductor island region including the breeder resistor, and the bipolar transistor of the output controlling transistor is a horizontal bipolar transistor or a vertical bipolar transistor including a second buried layer of a second conductivity type.

8. The semiconductor integrated circuit for a regulator according to claim 7, wherein the controller circuit comprises a vertical bipolar transistor which includes:

a first buried layer of a first conductivity type which is formed as a collector region in the semiconductor substrate;

a third diffusion layer of the second conductivity type which is formed as a base region in a surface of a semiconductor island region of an epitaxial layer above the first buried layer; and a fourth diffusion layer of the first conductivity type which is formed as an emitter region inside the base region.

\* \* \* \* \*

UNITED STATES PATENT AND TRADEMARK OFFICE
CERTIFICATE OF CORRECTION

PATENT NO. : 10,466,728 B2
APPLICATION NO. : 16/186099
DATED : November 5, 2019
INVENTOR(S) : Shinchiro Maki, Yoichi Takano and Katsuhiro Yokoyama Page 1 of 1

It is certified that error appears in the above-identified patent and that said Letters Patent is hereby corrected as shown below:

On the Title Page

Column 2, item (57) under "ABSTRACT", Line 3, delete "resister" and insert --resistor--.

Column 2, item (57) under "ABSTRACT", Line 5, delete "resister" and insert --resistor--.

Signed and Sealed this
Third Day of March, 2020

Andrei Iancu
*Director of the United States Patent and Trademark Office*